United States Patent [19]

Lee et al.

[11] Patent Number: 5,399,532
[45] Date of Patent: Mar. 21, 1995

[54] INTEGRATED CIRCUIT WINDOW ETCH AND PLANARIZATION

[75] Inventors: Kuo-Hua Lee, Lower Macungie Township, Lehigh County; Chen-Hua D. Yu, Allentown, both of Pa.

[73] Assignee: AT&T Corp., Murray Hill, N.J.

[21] Appl. No.: 924,415

[22] Filed: Jul. 30, 1992

Related U.S. Application Data

[63] Continuation of Ser. No. 707,721, May 30, 1991, abandoned.

[51] Int. Cl.$^6$ .......................................... H01L 21/465
[52] U.S. Cl. .................................. 437/228; 437/235; 437/240; 437/947; 156/643
[58] Field of Search ............... 437/164, 235, 228, 947, 437/240; 156/643

[56] References Cited

U.S. PATENT DOCUMENTS

| | | | |
|---|---|---|---|
| 4,743,564 | 5/1988 | Sato et al. | 437/24 |
| 4,807,016 | 2/1989 | Douglus | 156/643 |
| 4,879,257 | 7/1989 | Patrick | 437/195 |
| 4,892,753 | 1/1990 | Wang et al. | 427/294 |
| 4,952,524 | 8/1990 | Lee et al. | 437/982 |
| 4,966,865 | 10/1990 | Welch et al. | 437/192 |
| 4,978,420 | 12/1990 | Bach | 156/643 |

FOREIGN PATENT DOCUMENTS

| | | | |
|---|---|---|---|
| 1201582 | 3/1986 | Canada | 437/982 |
| 56-083947 | 7/1981 | Japan | 437/982 |
| 56-116641 | 9/1981 | Japan | . |
| 57-66651 | 4/1982 | Japan | . |
| 58-042254 | 3/1983 | Japan | 437/982 |
| 61-237448 | 10/1986 | Japan | 437/982 |
| 62-001232 | 1/1987 | Japan | 437/982 |
| 63-37638 | 2/1988 | Japan | . |
| 63-065647 | 3/1988 | Japan | 437/982 |
| 61-210162 | 3/1988 | Japan | . |
| 63-173344 | 7/1988 | Japan | . |
| 02047854 | 2/1990 | Japan | 437/982 |
| 0125449 | 5/1990 | Japan | . |
| 02125449 | 5/1990 | Japan | 437/982 |
| 02140957 | 5/1990 | Japan | 437/228 |

OTHER PUBLICATIONS

Ghandhi, Sorab K., *VLSI Fabrication Principles*, Wiley & Sons, NY, 1983 pp. 458–459.

*Primary Examiner*—George Fourson
*Assistant Examiner*—H. Jey Tsai
*Attorney, Agent, or Firm*—John T. Rehberg

[57] ABSTRACT

A method of semiconductor integrated circuit fabrication which provides a tapered window and a smoothed dielectric. A trench is made by etching through patterned photoresist into a dielectric. Then the corners of the trench are smoothed by thermal flow. Next the trench is etched downward by RIE blanket etchback. A window with tapered sides is thereby opened to the substrate and the dielectric is simultaneously smoothed.

11 Claims, 2 Drawing Sheets

INTEGRATED CIRCUIT WINDOW ETCH AND PLANARIZATION

This application is a continuation of application Ser. No. 07/707,721, filed on May 30, 1991, now abandoned.

TECHNICAL FIELD

This invention relates to a method of integrated circuit manufacture which includes fabricating tapered windows or vias and dielectric planarization.

BACKGROUND OF THE INVENTION

In a typical integrated circuit fabrication process, there is at least one fabrication step which patterns a dielectric layer to form windows in the dielectric which expose selected portions of an underlying layer. The windows in the dielectric are generally formed with vertical sidewalls made by a dry etching process and are typically filled with an electrically conducting material, e.g., aluminum or tungsten, to form an electrical contact to at least a portion of the underlying layer. While filling such windows with a metal is conceptually simple, problems arise in practice, and these problems become more severe as the dimensions of the windows continue to decrease. For example, aluminum deposition in small diameter windows may result in electrical discontinuities because typical aluminum deposition processes do not produce conformal layers. Aluminum is typically deposited by sputtering. The aluminum often forms re-entrant angles which make complete filling of high aspect ratio windows difficult.

Many of the problems associated with filling windows with metal or other conductive material may be alleviated by tapering the upper portion of the window so that it is wider at the top than at the bottom. Although producing a window with such a taper seems to be a simple solution to the problem described, it is not easily implemented in practice because the etching techniques widely used to pattern dielectric layers rely on etching which produces substantially vertical sidewalls, i.e., anisotropic etching. Thus, changing the etching technique to produce tapered sidewalls may not be simple. Additionally, whatever etching technique is used, the taper should not produce an excessive increase in window diameter at the underlying layer surface.

Another problem which confronts integrated circuit designers is planarization or dielectric smoothing. As integrated circuits become more complex, additional levels of metallization are often required. The layers of metallization are often separated by dielectric materials. It is desirable that each dielectric layer be comparatively smooth so that subsequently deposited metal can be adequately patterned to form runners.

One approach to dealing with the problem of forming vias and planarization is described in U.S. Pat. No. 4,879,257 issued on Nov. 7, 1989 to Patrick. The Patrick patent teaches the deposition of first and second dielectric layers and the etching of tapered windows through a selectively deposited resist. The windows are filled with metal and coated with resist. A resist etchback, i.e., a planarizing etch that removes resist and the second dielectric at approximately the same rate, is performed to yield a nominally planar dielectric surface having plugged vias.

SUMMARY OF THE INVENTION

The present invention does not require the use of plugs and provides tapered windows and a smoothed dielectric by a process which, illustratively, includes:

forming a dielectric layer upon a substrate;

etching the dielectric without exposing the substrate, thereby forming a trench with an upper edge and a lower edge;

smoothing the upper edge and the lower edge of the trench; and etching the dielectric so as to deepen said trench, thereby exposing the substrate at the bottom of the deepened trench.

Illustratively, the smoothing step is performed by heating the dielectric to cause it to flow, thus rounding or smoothing both the upper and lower edges of the trench, as well as smoothing the dielectric overall, achieving an overall smoothing or planarization.

DETAILED DESCRIPTION

Figure 1:
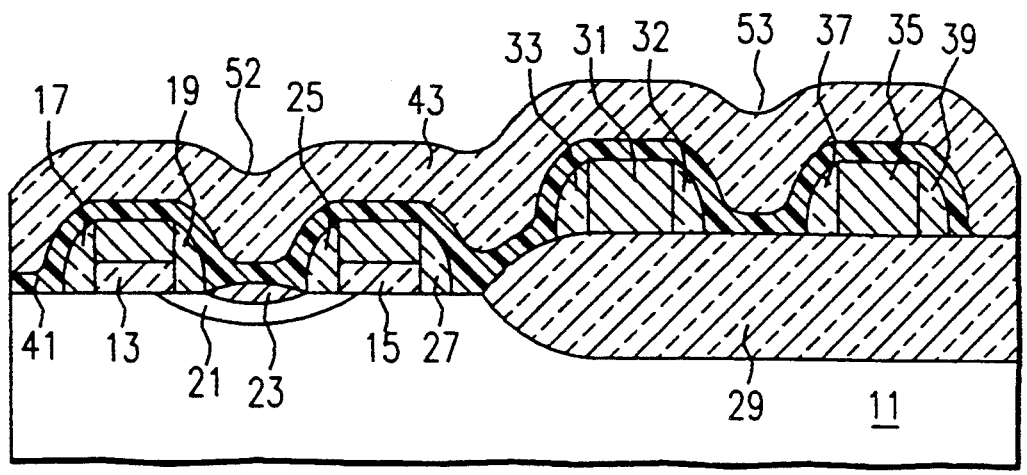
FIGS. 1-4 are cross-sectional views of a portion of an integrated circuit useful in explaining the method of this invention. For reasons of clarity, the elements depicted are not drawn to scale.

FIG. 1 is a cross-sectional view of a partially fabricated integrated circuit. Generally, the term "substrate" is a material which lies beneath and supports another material, including possibly patterned features. Substrate 11 may be silicon, epitaxial silicon, etc. Reference numeral 29 designates a field oxide. Reference numerals 13 and 15 designate gates which are flanked by spacers 17, 19, 25, and 27. Junction 21 extends between gates 13 and 15. Silicide region 23 is formed between spacers 19 and 25. Silicide 23 is optional. Gate runners 31 and 35 are positioned atop field oxide 29. Runners 31 and 35 are flanked by spacers 33, 32, 37, and 39.

Although FIG. 1 depicts two gates 13 and 15 with a junction 21 between them, the invention is applicable to the creation of windows in any portion of an integrated circuit, including the formation of vias for upper levels of metallization. Dielectric 41 is, illustratively, a thin layer of LPCVD undoped TEOS oxide of approximately 1500 Å thickness. Dielectric 43 is a second layer of TEOS oxide doped with boron and phosphorous (illustratively four weight percent each). The thickness of dielectric 43 (often termed BPTEOS) ranges illustratively from 0.9 microns to 1.5 microns.

The presence of undoped dielectric layer 21 helps to prevent the dopants in dielectric 43 from degrading either silicide 23 or junction 21.

It will be noted that there exist slight dimples 52 and 53 in upper dielectric 43 due to the conformal nature of its deposition.

Figure 2:
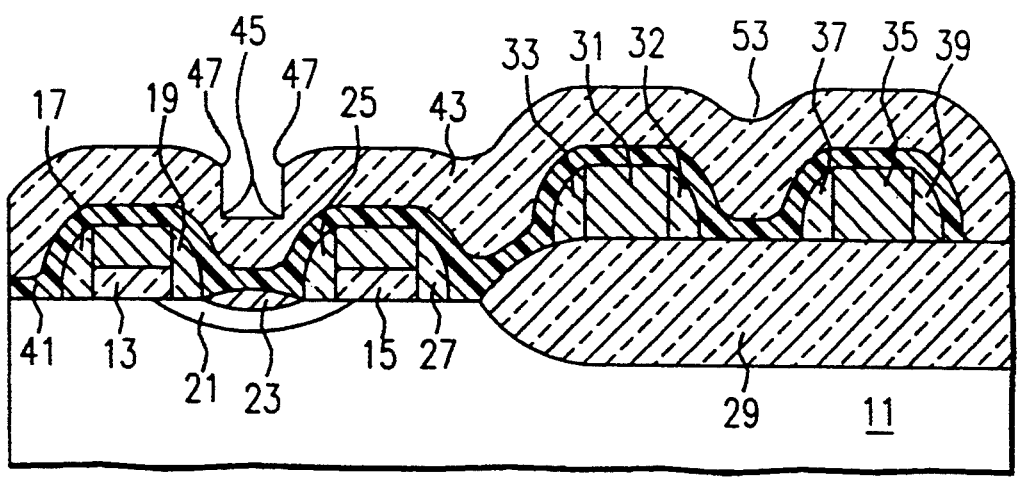

Turning to FIG. 2, window photolithography is performed (typically using a patterned photoresist in anisotropic etching) to create trench 45. The depth of trench 45 is approximately 7000 Å (for the case of 9000 Å deposition). Whatever initial thickness of BPTEOS is used, it is important that the trench not extend to the bottom of the BPTEOS layer. Some BPTEOS must remain or else the trench will exhibit a re-entrant shape after flow. Approximately at least 2000 Å BPTEOS remaining below the trench is desirable. It will be noted that sharp edge 47 exists at the top of trench 45 and a sharp edge 48 exists at the bottom of trench 45. Photoresist is removed after trench 45 is formed.

Figure 3:
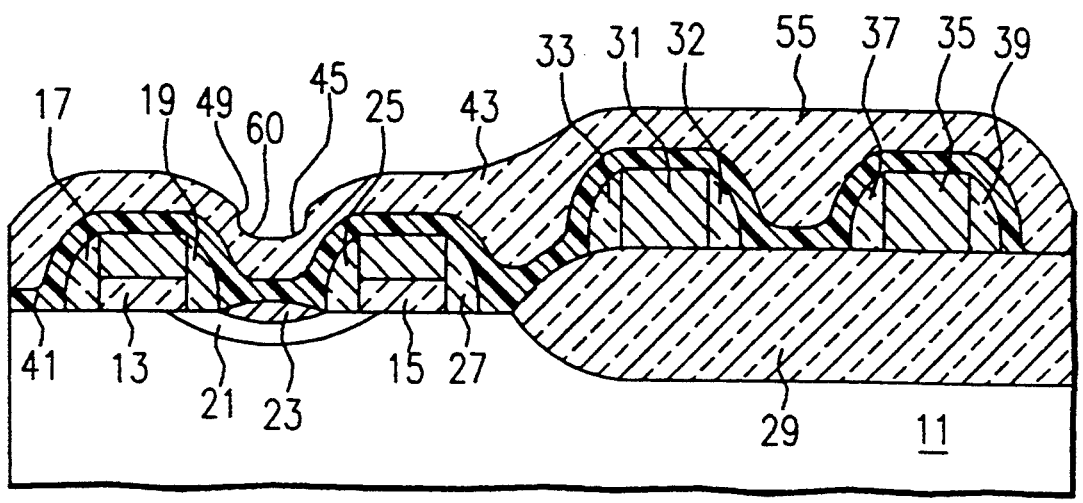

Turning to FIG. 3, dielectric 43 is smoothed by flowing. The dielectric is exposed to an approximately 800° C.±25°, three to 30 minute flow in a furnace. The flowing process serves to smooth sharp edges 47 and 48, making them more rounded as shown by reference numerals 49 and 60, respectively, in FIG. 3. Furthermore, the flow process serves to provide an overall smoothing of dielectric layer 43 and tends to remove dimple 53, thus providing a local planarization.

Thus, it should be noted that the flow process creates a trench 45 which, because of the rounded upper and lower edges, has a larger opening at the top tapering to a smaller opening at the bottom.

Figure 4:
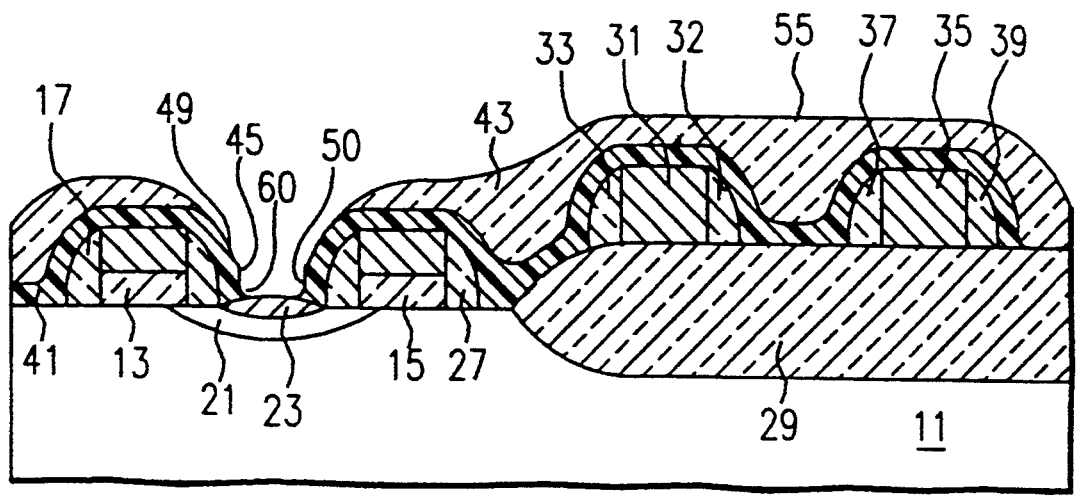

FIG. 4 illustrates the completion of the process. In FIG. 4, a reactive ion etch (RIE) blanket etchback is performed. The RIE blanket etchback serves to transfer trench 45 downward, eventually causing a window above silicide 21. Tapered edges 49 and 60 of FIG. 3 are also transferred downward as shown in FIG. 4. The resulting window has a short vertical sidewall 50 and tapered edges 49 and 60. (In the example illustrated, most of layer 43 has been etched away, exposing layer 41 near window 45.) Window 45 is now ready for subsequent deposition of a metal, such as aluminum, and patterning of the aluminum to form runners. Contact to the underlying silicide 23 (if present) and junction 21 is thusly effected. The process may also be used advantageously if the windows are filled with conductive plugs. (The smoothed contours of the window at the top and bottom edges facilitate good step coverage of sputtered plug materials.)

The degree of smoothing obtained by the flow step depends upon the time and temperature to which layer 43 is exposed during the flow process. If the flow temperature and time are increased, a more tapered profile results. For example, flow in a furnace at 800° C. for 120 minutes produces the same markedly more tapered profile. Eventually, the window can be sealed (i.e., the bottom edges smoothed together) by performing a flow at a temperature of 900°–950° C.

Several advantages of the flow step are worth mentioning. The flow step provides a smoothing of both the upper and lower edges, as mentioned before, thus providing an excellent interior surface for deposition of metals such as aluminum. Because the lower edges are smoothed, the opening at the bottom of the window, as can be seen from FIG. 4, is slightly smaller (typically by 0.1 μm or so) than the dimension of the lithographically-defined trench. Thus, more severe design rules may be accommodated. The size of the window opening at the substrate surface is smaller than lithographically-defined dimensions of the window. Control of the smoothing is accomplished by adjustment of the time and temperature of the flow step as well as by adjustment of the dopant concentration in the BPTEOS.

The presence of TEOS layer 41 prevents migration of dopants in layer 43 from affecting or degrading either optional silicide 23 or junction 21. Should layer 41 be eliminated, the process is still generally viable because the flow step is performed as illustrated in FIG. 3 before the window has been completely opened, exposing either silicide 23 or junction 21.

Generally, as the thickness of layer 43 is increased, the controllability of the RIE blanket etchback process is improved. In standard plasma RIE chemistry, the etch rate of TEOS is approximately 60% of BPTEOS. Applicants have determined that a minimum thickness of 0.9 microns is generally required to insure that there is sufficient BPTEOS interlevel dielectric left after the blanket etchback is performed and the window is opened. The reactive ion etching may be performed using $CHF_3$ plus oxygen chemistry in, for example, hexode etcher.

The inventive process may also be practiced in a single wafer machine, such as an "AMI 5000", manufactured by Applied Materials Inc., Santa Clara, Calif. The single wafer machine may be utilized for TEOS and BPTEOS deposition as well as etching. The process may also be employed in apparatus manufactured by Novellus Inc.

We claim:

1. A method of semiconductor integrated circuit fabrication comprising:
   forming an undoped oxide dielectric upon a silicon substrate, said undopeal oxide dielectric having an etch rate;
   forming a doped dielectric having an initial thickness, upon said undoped oxide dielectric; said doped dielectric having an etch rate which is greater than the etch rate of said undoped oxide dielectric;
   etching said doped dielectric material without exposing said undoped oxide dielectric thereby forming a trench with an upper edge and a lower edge;
   smoothing said upper edge and said lower edge of said trench; and then
   blanket etching said doped dielectric and said undoped oxide dielectric to deepen said trench, thereby exposing said substrate at the bottom of said deepened trench,
   the said initial thickness of said doped dielectric being chosen so that a portion of said doped dielectric layer remains above said undoped oxide dielectric away from said trench after said substrate is exposed.

2. The method of claim 1 in which said doped dielectric is BPTEOS.

3. The method of claim 1 in which said smoothing step is accomplished by heating said dielectric thereby causing said dielectric to flow.

4. The method of claim 3 in which said smoothing step is performed at a temperature of 800° C.±25° and a time of 3 to 30 minutes.

5. The method of claim 1 in which said, blanket etching is performed by reactive ion etching utilizing $CHF_3$ and oxygen.

6. The method of claim 1 further including the step of filling said trench with conductive material which contacts said substrate.

7. The method of claim 1 further including the step of forming a silicide layer overlying said substrate and also including the step of filling said trench with conductive material which contacts said silicide.

8. The method of claim 2 in which the thickness of said BPTEOS is between 0.9 μm and 1.5 μm.

9. The method of claim 8 in which at least 2000 Å of BPTEOS material remains below said trench.

10. The method of claim 1 in which said undoped oxide dielectric is formed from TEOS.

11. The method of claim 10 in which the thickness of said TEOS layer 2 is approximately 1500 Å.

* * * * *